(12) United States Patent
Chang et al.

(10) Patent No.: US 8,168,992 B2
(45) Date of Patent: *May 1, 2012

(54) LIGHT-EMITTING DIODE BACKLIGHT MODULE

(75) Inventors: Chia-Hsien Chang, Changhua County (TW); Yi-Tsuo Wu, Jhonghe (TW); Hsiao-Chiao Li, Sinjhuant (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/033,856

(22) Filed: Feb. 24, 2011

(65) Prior Publication Data

US 2011/0140157 A1 Jun. 16, 2011

Related U.S. Application Data

(63) Continuation of application No. 12/344,108, filed on Dec. 24, 2008, now Pat. No. 7,919,789.

(30) Foreign Application Priority Data

Dec. 27, 2007 (TW) .............................. 96150590 A

(51) Int. Cl.
*H01L 33/60* (2010.01)
(52) U.S. Cl. .................................. 257/98; 257/E33.068

(58) Field of Classification Search .................. None
See application file for complete search history.

(56) References Cited

U.S. PATENT DOCUMENTS

| 7,919,789 B2 * | 4/2011 | Chang et al. ................... 257/99 |
| 2007/0165417 A1 | 7/2007 | Wu et al. |
| 2008/0315214 A1 | 12/2008 | Wall, Jr. et al. |

FOREIGN PATENT DOCUMENTS

| CN | 1442910 A | 9/2003 |
| JP | 2005-513815 | 5/2005 |
| JP | 2005513815 | 5/2005 |
| JP | 2006-114854 | 4/2006 |
| JP | 2006114854 A | 4/2006 |
| JP | 2007-95555 | 4/2007 |
| JP | 2007095555 A | 4/2007 |

* cited by examiner

*Primary Examiner* — Eugene Lee
*Assistant Examiner* — Monica D Harrison
(74) *Attorney, Agent, or Firm* — Han IP Law PLLC; Andy M. Han

(57) ABSTRACT

A light-emitting diode backlight module includes a base and a light source disposed on the base. The light source comprises a substrate, a heat sink and an LED chip. The base has a heat conductor. The heat sink of the light source is coupled between the substrate of the light source and the heat conductor of the base. The heat sink has a first part which is adjacent a first side of the substrate and a second part which is adjacent a second side of the substrate. The heat sink is in contact with the heat conductor. The LED chip is disposed on the first part of the heat sink and emits light laterally.

18 Claims, 2 Drawing Sheets

LIGHT-EMITTING DIODE BACKLIGHT MODULE

RELATED APPLICATIONS

This application is a continuation application of co-pending U.S. patent application Ser. No. 12/344,108 entitled "Lateral Light-Emitting Diode Backlight Module", filed on Dec. 24, 2008, which claims priority to Taiwan Application Serial Number 096150590, filed Dec. 27, 2007, which applications are hereby incorporated in their entirety by reference.

BACKGROUND

1. Technical Field

The present disclosure relates to a light-emitting diode backlight module. More particularly, the present disclosure relates to a light-emitting diode backlight module with disconnected paths of heat dissipation and electric power conduction.

2. Description of Related Art

White light-emitting diode (white LED) lamps have gradually superseded cold cathode fluorescent lamps (CCFL) in different size backlight modules. Applying lateral light-emitting diodes as a light source can reduce the depth of the backlight module to satisfy the needs of thin products.

Heat dissipation is always a major choking point in LED backlight module development. In accordance with medium and large sized LED backlight modules, the heat accumulation of the LED chip brings wavelength change and luminosity loss. For the forgoing reasons, there is a need to improve the heat dissipation capability to maintain the luminosity of LED and extend the life of the LED backlight module.

Conventional lateral light-emitting diodes employ leadframes to dissipate heat, whereby both heat dissipation and electric power conduction are performed at same time. However, the heat dissipation function of the leadframe is not sufficient to handle higher and higher power requirement of the high power LEDs.

SUMMARY

The present disclosure is directed to a light-emitting diode backlight module (lateral LED backlight module) to improve heat dissipation capability of the LED backlight module.

In accordance with the embodiments of the present disclosure, a light-emitting diode backlight module includes a base and a light source disposed on the base. The light source comprises a substrate, a heat sink and an LED chip. The base has a heat conductor. The heat sink of the light source is coupled between the substrate of the light source and the heat conductor of the base. The heat sink has a first part which is adjacent a first side of the substrate and a second part which is adjacent a second side of the substrate. The heat sink is in contact with the heat conductor. The LED chip is disposed on the first part of the heat sink and emits light laterally.

In conclusion, the LED backlight module of the embodiment of the present disclosure ensures the heat conductor touches the heat sink of the light emitting diode to transfer heat from the heat sink to the heat conductor, whereby both the heat dissipation area and volume can be enlarged to improve the heat dissipation capability of the LED backlight module.

Moreover, the present disclosure provides a LED backlight module with disconnected paths of heat dissipation and electric power conduction, whereby the balancing point of the heat and electric power can be controlled to maintain the performance of the LED backlight module.

BRIEF DESCRIPTION OF THE DRAWINGS

These and other features, aspects, and advantages of the present disclosure will become better understood with regard to the following description, appended claims, and accompanying drawings where:

DESCRIPTION OF THE PREFERRED EMBODIMENTS

Figure 1:
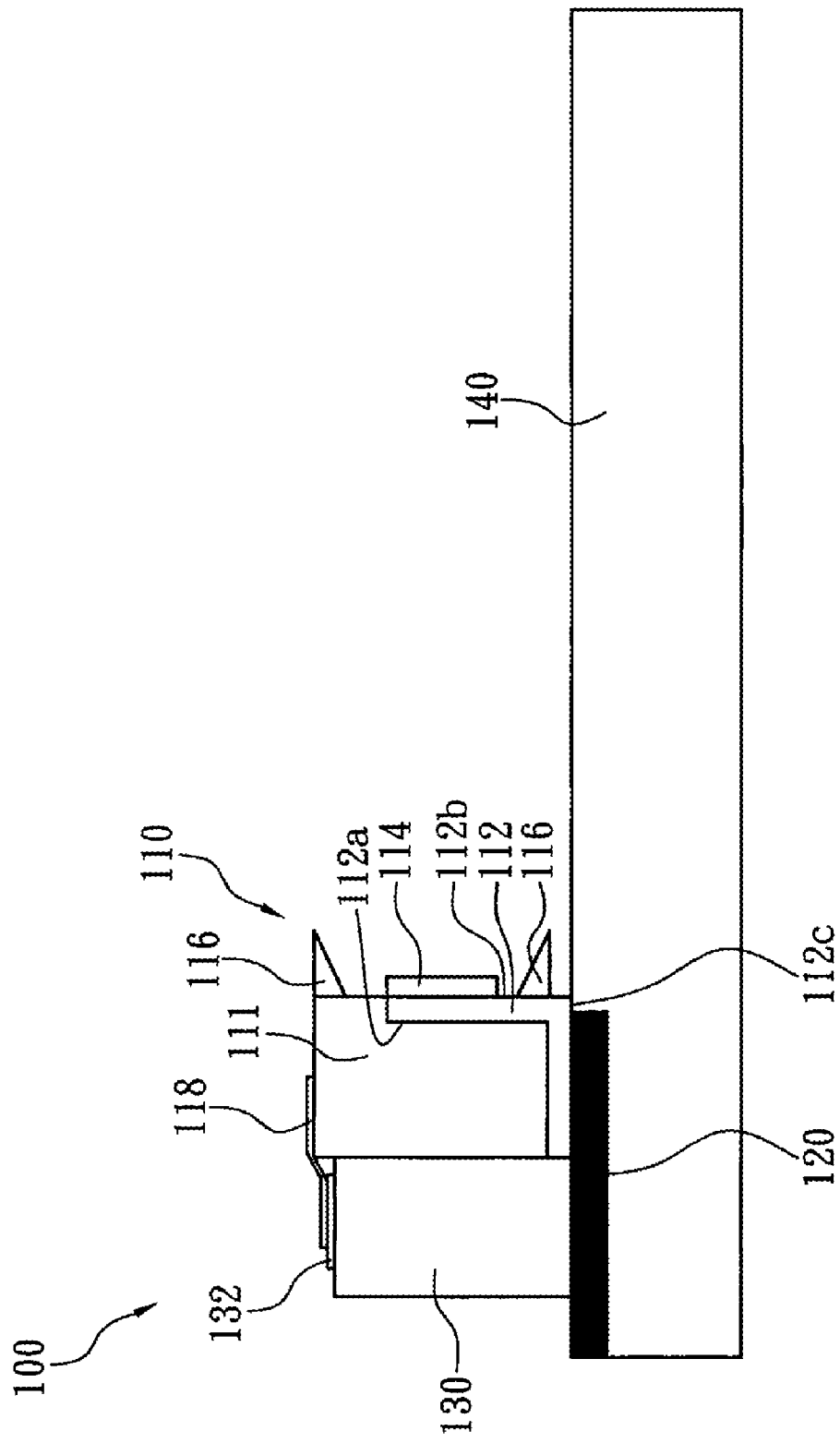
FIG. 1 is a schematic sectional view of the LED backlight module in accordance with an embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts.

FIG. 1 is a schematic sectional view of the LED backlight module in accordance with an embodiment of the present disclosure. LED backlight module 100 includes a light emitting diode device 110, a heat conductor 120, a circuit board 130, and a base 140.

The light emitting diode device 110 includes a substrate 111, a heat sink 112, an LED chip 114, and a plurality of pins 118. The heat sink 112 is fastened to the substrate 111 and connected to the heat conductor 120. The LED chip 114 is disposed on the heat sink 112 and emits light laterally. The pins 118 are mounted on the substrate 111 and extended to the circuit board 130.

The heat sink 112 has an inner surface 112a, a chip-mounting surface 112b, and an outer surface 112c. In accordance with the embodiment of the present disclosure, the inner surface 112a is connected with a surface of the substrate 111, wherein the substrate comprises metal, non-metal, and polymer. The chip-mounting surface 112b, on the opposing side of the inner surface 112a, provides a chip mounting area to mount an LED chip. The outer surface 112c is connected with a surface of the heat conductor 120 to dissipate the heat derived from the LED chip 114 through the heat sink 112 to the heat conductor 120 of the base 140. The heat sink 112 comprises heat conducting material, such as silver, copper, copper alloys, silver-copper alloys, aluminum, aluminum alloys, ceramic material, and polymers. In an embodiment of the present disclosure, the heat sink 112 further comprises a reflective coating layer, such as gold or silver coating layer.

In accordance with an embodiment of the present disclosure, a reflector 116 is disposed on the chip-mounting surface 112b of the heat sink 112 to provide an inner space to define the chip-mounting area and reflect the light emitted from the LED chip 114. The reflector 116 comprises metal, non-metal or polymer. In an embodiment of the present disclosure, the reflector 116 further comprises a reflective layer formed on an inner wall of the reflector 116, such as a gold coating layer or a silver coating layer.

The circuit board 130 is disposed on the heat conductor 120 of the base 140 and connected to the substrate 111 of the light emitting diode device 110. In an embodiment of the present disclosure, the heat conductor 120 comprises silver, copper, aluminum, or an alloy thereof, and the circuit board 130 comprises an insulating material.

Figure 2:
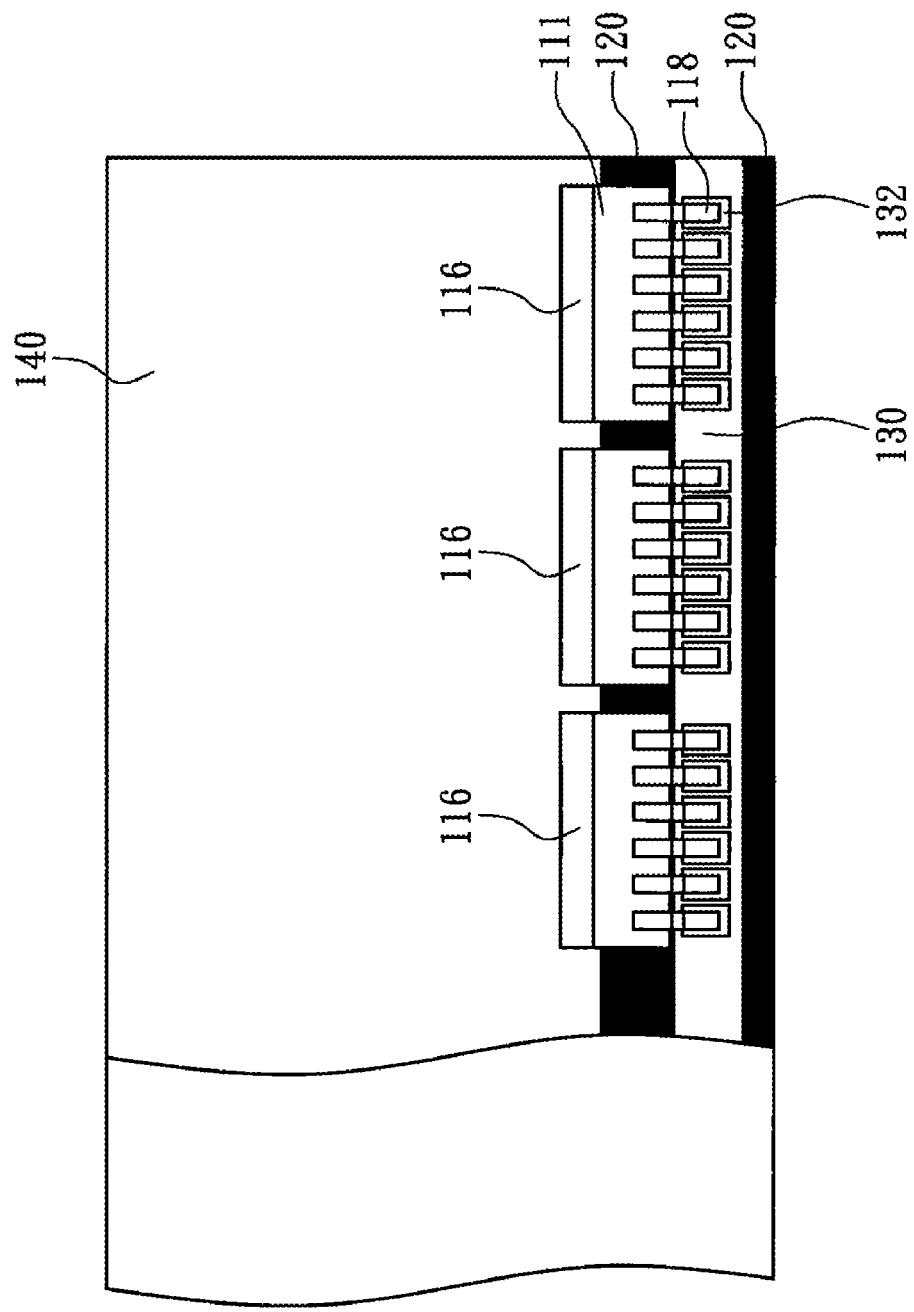
FIG. 2 is a schematic vertical view of the LED in FIG. 1.

A conductive pad 132 is formed on a surface of the circuit board 130 and connected with the pin 118. In an embodiment of the present disclosure, the pin 118 comprises silver, copper, aluminum, or an alloy thereof. The pin 118 is mounted on the substrate 111 and extended from the substrate 111 to connect with the conductive pad 132. FIG. 2 is a schematic vertical view of the LED backlight module in FIG. 1.

The heat conductor 120 is mounted on the base 140, and the circuit board 130 is mounted on the heat conductor 120. A plurality of conductive pads 132 are set on the circuit board 130 to provide the electric power. In accordance with an embodiment of the present disclosure, the base 140 is formed by a heat conductive metal material, such as silver, copper, aluminum, an alloy thereof, or a ceramic material (such as aluminum oxide or aluminum nitride).

A plurality of the light emitting diode devices 110 are mounted on the heat conductor 120 and a portion of the base 140 to form a backlight module, wherein the outer surface 112c of the heat sink 112 of each light emitting diode device 110 is mounted to a surface of the heat conductor 120.

The engaged substrate 111 and the heat sink substrate 112 contribute to heat conduction from the light emitting diode device 110 to the heat conductor 120. That is, the heat produced by the LED chips 114 is transferred to the heat conductor 120 via the substrate 111 and the heat sink 112, whereby both the heat dissipation area and volume can be enlarged to improve the heat dissipation capability of the LED backlight module 100.

The reflector 116 reflects the light beam emitted from the LED chips 114 to enhance the lighting efficiency, whereby the luminosity of the backlight module can be improved.

Each pin 118 mounted on the substrate 111 of the light emitting diode device 110 is extended from the substrate 111 and connected to the respective conductive pad 132 of the circuit board 130 to input electric power.

In summary, the pins of the LED backlight module in accordance with embodiments of the present disclosure only function as a conductive electrode, and the heat sink and the heat conductor dissipate the heat derived from the LED chip, whereby the paths of heat dissipation and electric power conduction are disconnected. Therefore, the balancing point of the heat dissipation and electric power conduction can be controlled to maintain the performance of the LED backlight module.

Although the present disclosure has been described in considerable detail with reference t certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A light-emitting diode (LED) backlight module, comprising:
   a base having a heat conductor therein; and
   a light source disposed on the base, the light source comprising:
   a substrate;
   a heat sink coupled between the substrate and the heat conductor, the heat sink having a first part that is adjacent a first side of the substrate and a second part that is adjacent a second side of the substrate and in contact with the heat conductor; and
   an LED chip disposed on the first part of the heat sink and configured to emit light laterally.

2. The LED backlight module of claim 1, further comprising:
   a reflector disposed on the first side surface of the substrate for reflecting the light emitted from the LED chip.

3. The LED backlight module of claim 2, further comprising:
   a reflective layer formed on an inner side-wall of the reflector.

4. The LED backlight module of claim 3, wherein the reflective layer comprises a gold coating layer or a silver coating layer.

5. The LED backlight module of claim 2, wherein the reflector comprises metal, non-metal, or polymer.

6. The LED backlight module of claim 1, wherein the base comprises a heat conductive material.

7. The LED backlight module of claim 6, wherein the heat conductive material comprises ceramic material, silver, copper, aluminum, or an alloy thereof.

8. The LED backlight module of claim 7, wherein the ceramic material comprises aluminum oxide or aluminum nitride.

9. The LED backlight module of claim 1, wherein the heat conductor comprises silver, copper, aluminum, or an alloy thereof.

10. The LED backlight module of claim 1, wherein the substrate comprises metal, non-metal, and polymer.

11. The LED backlight module of claim 1, wherein the heat sink comprises silver, copper, an alloy thereof, ceramic material, or polymer.

12. The LED backlight module of claim 1, further comprising:
    a reflective coating layer formed on the heat sink.

13. The LED backlight module of claim 12, wherein the reflective coating layer comprises a gold coating layer or a silver coating layer.

14. The LED backlight module of claim 1, wherein heat from the LED chip is transferred to the heat conductor via the substrate and the heat sink.

15. The LED backlight module of claim 1, further comprising:
    a circuit board having a conductive pad formed on a surface thereof, the circuit board disposed on the heat conductor and connected to the substrate.

16. The LED backlight module of the claim 15, wherein the circuit board comprises an insulating material.

17. The LED backlight module of claim 1, wherein the at least one LED device further comprises:
    a pin mounted on the substrate and extended to the conductive pad of the circuit board.

18. The LED backlight module of the claim 17, wherein the pin comprises silver, copper, aluminum, or an alloy thereof.

* * * * *